(12) United States Patent
Lee et al.

(10) Patent No.: US 10,943,791 B2
(45) Date of Patent: Mar. 9, 2021

(54) PATTERN FORMATION METHOD AND METHOD FOR MANUFACTURING A SEMICONDUCTOR DEVICE (71) Applicant: TAIWAN SEMICONDUCTOR MANUFACTURING CO., LTD., Hsinchu (TW)

(72) Inventors: Yi-Chang Lee, Taoyuan (TW); Jiann-Horng Lin, Hsinchu (TW); Chih-Hao Chen, Hsinchu (TW); Ying-Hao Wu, Taoyuan (TW); Wen-Yen Chen, Chu Tung Township (TW); Shih-Hua Tseng, Hsinchu (TW); Shu-Huei Suen, Jhudong Township (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/428,029

(22) Filed: May 31, 2019

(65) Prior Publication Data
US 2020/0135487 A1 Apr. 30, 2020

Related U.S. Application Data (60) Provisional application No. 62/753,901, filed on Oct. 31, 2018.

(51) Int. Cl.
H01L 21/311 (2006.01)
H01L 21/027 (2006.01)
H01L 21/02 (2006.01)

(52) U.S. Cl.
CPC .... *H01L 21/31144* (2013.01); *H01L 21/0206* (2013.01); *H01L 21/0271* (2013.01); *H01L 21/02271* (2013.01); *H01L 21/31116* (2013.01)

(58) Field of Classification Search
CPC ......... H01L 21/31144; H01L 21/31116; H01L 21/0206; H01L 21/0271; H01L 21/02271
USPC ........................................ 438/706–725, 736
See application file for complete search history.

(56) References Cited

U.S. PATENT DOCUMENTS

| | | | |
|---|---|---|---|
| 2002/0058421 A1 | 5/2002 | Hui et al. | |
| 2004/0121597 A1* | 6/2004 | Chung | H01L 21/32139 438/689 |
| 2010/0009542 A1* | 1/2010 | Honda | H01L 21/0212 438/702 |
| 2013/0040102 A1* | 2/2013 | Gleason | B05D 1/62 428/141 |
| 2014/0162194 A1* | 6/2014 | Xu | H01L 21/02118 430/403 |
| 2018/0286828 A1* | 10/2018 | Leobandung | H01L 24/13 |

* cited by examiner

*Primary Examiner* — Duy Vu N Deo
(74) *Attorney, Agent, or Firm* — McDermott Will & Emery LLP (57) ABSTRACT In a pattern formation method, a photo resist pattern is formed over a target layer to be patterned. An extension material layer is formed on the photo resist pattern. The target layer is patterned by using at least the extension material layer as an etching mask.

20 Claims, 8 Drawing Sheets

PATTERN FORMATION METHOD AND METHOD FOR MANUFACTURING A SEMICONDUCTOR DEVICE

RELATED APPLICATION

This application claims priority of U.S. Provisional Patent Application No. 62/753,901 filed in Oct. 31, 2018, the entire contents of which are incorporated herein by references.

BACKGROUND

As the semiconductor industry has progressed into nanometer technology process nodes in pursuit of higher device density, higher performance, and lower costs, challenges from both fabrication and design issues have greater. For example, multilayer mask structures are used for forming contact holes (vias) and/or metal connections in and/or through an interlayer dielectric (ILD) layer disposed above a semiconductor device, such as field effect transistors (FETs).

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In the following embodiments, material, configurations, dimensions, operations and/or processes of one embodiment may be employed in another embodiment, unless otherwise described, and detailed explanation thereof may be omitted.

Various embodiments of the disclosure relate to a pattern formation method, in particular, for a semiconductor device.

In various embodiments, the semiconductor device includes fin field effect transistors (FinFETs), gate all-around FET (GAA FET), and/or other MOS transistors, together with capacitors, resistances and/or other electronic elements.

As the design rule for a semiconductor integrated circuit becomes below about 15 nm, requirements for lithography operations to form finer patterns becomes tighter. For example, a thickness of photo resist becomes thinner. However, since the photo resist pattern is used as an etching mask when an underlying layer is etched, the thin photo resist layer may not have a sufficient thickness for the etching. Further, after the photo resist layer is developed, a resist scum (residue) may remain between photo resist patterns. In addition, the thickness of the photo resist pattern may become uneven, which would cause a pattern defect.

In the present disclosure, pattern formation methods to resolve the aforementioned issues are provided.

FIGS. 1A-1E show a sequential pattern formation operation according to an embodiment of the present disclosure. It is understood that additional operations can be provided before, during, and after the operations shown by FIGS. 1A-1E, and some of the operations described below can be replaced or eliminated, for additional embodiments of the method. The order of the operations/processes may be interchangeable.

Figure 1A:
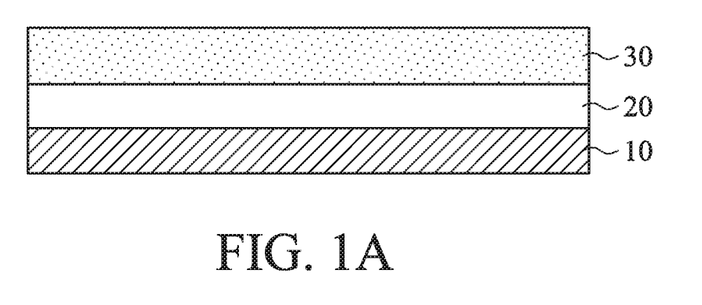
FIG. 1A is a cross sectional view of one of the various stages of a sequential pattern formation operation according to an embodiment of the present disclosure.

As shown in FIG. 1A, a target layer 20 to be patterned is formed over a substrate 10, and a photo resist layer 30 is formed over the target layer 20. In some embodiments, underlying devices are formed over the substrate 10, and the target layer 20 covers the underlying devices. Examples of the underlying devices may include static random access memory (SRAM) and/or other logic circuits; passive components such as resistors, capacitors, and inductors; and active components such as P-channel field effect transistors (PFET), N-channel FET (NFET), metal-oxide semiconductor field effect transistors (MOSFET); complementary metal-oxide semiconductor (CMOS) transistors, such as a FinFET; bipolar transistors; high voltage transistors; high frequency transistor; other memory cells, and combinations thereof. The semiconductor device may include a plurality of semiconductor devices (e.g., transistors), which may be interconnected. It is understood, however, that the application should not be limited to a particular type of device, except as specifically claimed.

In some embodiments, the substrate 10 is a silicon substrate. Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or an insulating material, such as silicon oxide may also be used as the substrate 10. The substrate 10 may include various regions that have been suitably doped with impurities (e.g., p-type or n-type conductivity).

The target layer 20 is a dielectric layer, a conductive layer or a semiconductor layer, and the combination thereof. The dielectric layer includes silicon oxide, silicon nitride, silicon oxynitride (SiON), SiOCN, fluorine-doped silicate glass (FSG), or a low-k dielectric material (e.g., SiOC and SiOCN), or any other suitable dielectric material. The dielectric layer can be formed by chemical vapor deposition (CVD) or other suitable film forming processes. The conductive layer includes a metallic layer made of Cu, Al, AlCu, Ti, TiN, Ta, TaN, W, Co, Ni, silicide thereof, or other suitable conductive material. The semiconductor layer includes poly silicon, amorphous silicon or any other suitable semiconductor material.

The photo resist layer 30 is a positive tone photo resist or a negative tone photo resist. The thickness of the photo resist layer 30 is in a range from about 50 nm to about 500 nm in some embodiments, and is in a range from about 100 nm to about 200 nm in other embodiments. The photo resist layer 30 is spin-coated over the target layer 20 and a pre-baking operation is performed in some embodiments. In some embodiments, a bottom anti-reflection coating is formed between the photo resist layer 30 and the target layer 20.

Then, the photo resist layer 30 is exposed to an exposure energy beam, such as KrF excimer layer, ArF excimer laser and an EUV light, through a photo mask having circuit patterns, in some embodiments. In other embodiments, an electron beam is used.

Figure 1B:
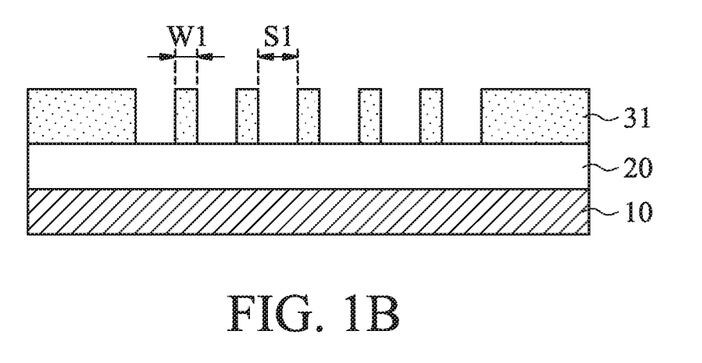
FIG. 1B is a cross sectional view of one of the various stages of a sequential pattern formation operation according to an embodiment of the present disclosure.
Figure 1C:
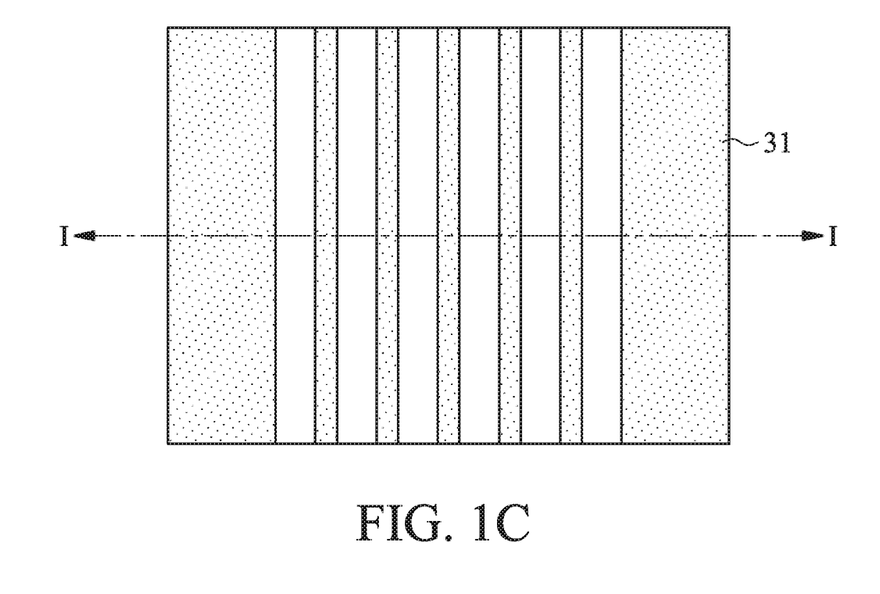
FIG. 1C is a top view (plan view) of one of the various stages of a sequential pattern formation operation according to an embodiment of the present disclosure.

After the exposed photo resist layer is developed with an appropriate developing solution, a photo resist pattern 31 is formed over the target layer 20, as shown in FIGS. 1B and 1C. FIG. 1B is a cross sectional view, and the FIG. 1C is a plan view. After the development, a post baking process is performed. In some embodiments, a curing operation, such as UV curing, is performed to harden the developed photo resist pattern.

In some embodiments, the photo resist pattern 31 includes line-and-space patterns. A line pattern made of the photo resist layer has a width W1 in a range from about 5 nm to about 20 nm in some embodiments. A space S1 between adjacent lines is in a range from about 5 nm to about 40 nm in some embodiments, and is in a range from about 5 nm to about 20 nm in some embodiments. The ratio S1/W1 is in a range from about 1 to about 4 in some embodiments. In some embodiments, as shown in FIG. 1C, no pattern (space) is formed at areas outside the area in which the line-and-space patterns are disposed. In some embodiments, multiple areas in which the line-and-space patterns are disposed separated by a non-pattern area are provided. A width or length of the non-pattern area is greater than 100 nm in some embodiments. In some embodiments, an aspect ratio of each of the line patterns is at least 2. In certain embodiments, the aspect ratio is smaller than 40.

Figure 1D:
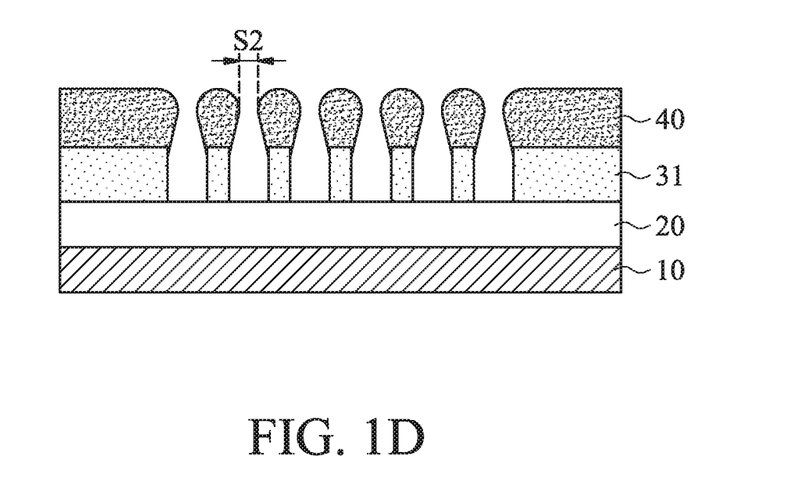
FIG. 1D is a cross sectional view of one of the various stages of a sequential pattern formation operation according to an embodiment of the present disclosure.

Next, as shown in FIG. 1D, an extension material layer 40 is deposited over the photo resist pattern 31. As shown in FIG. 1D, the extension material layer is formed on each of the line patterns and on the non-pattern area. The extension material layer 40 is formed by chemical vapor deposition (CVD) under a non-conformal deposition condition in some embodiments. A space S2 between the adjacent extension material layers 40 is in a range from about 2 nm to about 30 nm in some embodiments.

Figure 2A:
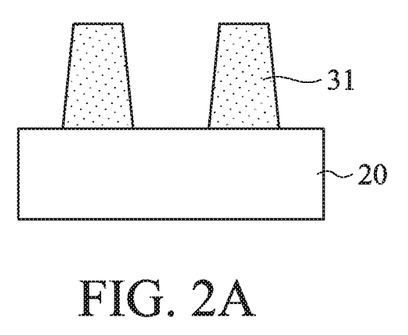
FIG. 2A is a cross sectional view of one of the various stages of a sequential pattern formation operation according to an embodiment of the present disclosure.
Figure 2B:
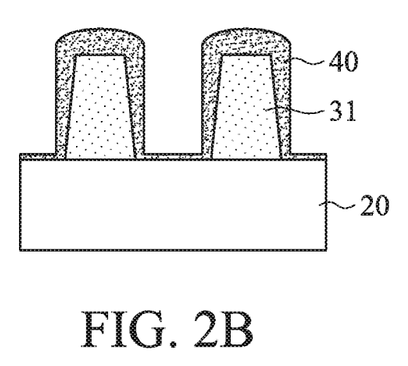
FIG. 2B is a cross sectional view of one of the various stages of a sequential pattern formation operation according to an embodiment of the present disclosure.
Figure 2C:
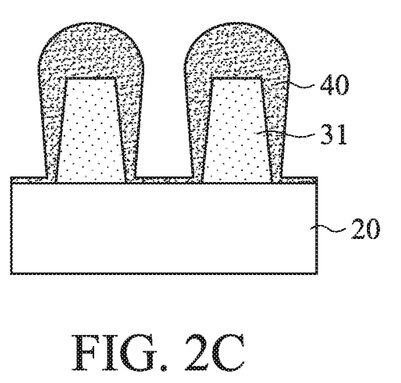
FIG. 2C is a cross sectional view of one of the various stages of a sequential pattern formation operation according to an embodiment of the present disclosure.
Figure 2D:
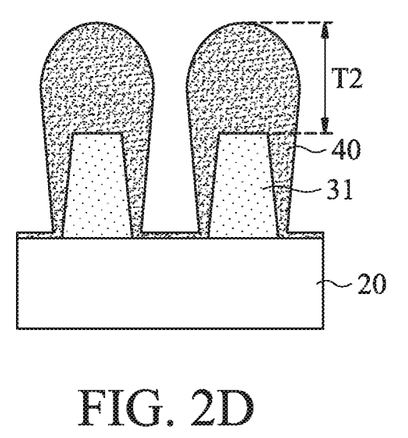
FIG. 2D is a cross sectional view of one of the various stages of a sequential pattern formation operation according to an embodiment of the present disclosure.

FIGS. 2A-2E show details of the non-conformal deposition of the extension material layer 40. FIG. 2A shows an enlarged cross sectional view of two line patterns 31 (photo resist layer). One or more source gases for forming the extension material layer 40 are provided over the photo resist patterns 31. Initially, the source gases and/or reacted products cover the top face of the photo resist pattern 31, the side faces of the photo resist pattern 31 and the surface of the target layer 20 between the photo resist patterns 31, forming a thin layer of the extension material layer 40. When the deposition condition is non-conformal, a deposition rate of the extension material layer 40 at the top face of the photo resist pattern 31 is greater than a deposition rate of the extension material layer 40 at the side faces and a deposition rate of the extension material layer at the surface of the target layer. Further, the deposition of the extension material layer 40 in a lateral direction also occurs. Accordingly, as shown in FIGS. 2C and 2D, the extension material layer 40 is formed like a mushroom or balloon shape. Once the mushroom shape is formed, a space between the extension material layers deposited over adjacent line patterns becomes smaller, which further suppresses the deposition of the extension material layer on the side faces of the photo resist pattern 31 and on the surface of the target layer 20.

As shown in FIG. 2D, a thickness T1 of the extension material layer 40 deposited at the surface of the target layer 20 between the adjacent photo resist patterns 31 is much smaller than a thickness T2 of the extension material layer 40 deposited at the top face of the photo resist pattern 31. In some embodiments, $2 \leq T2/T1$ is satisfied. In other embodiments, $30 \leq T2/T1 \leq 300$ is satisfied. In some embodiments, thickness T2 is in a range from about 10 nm to about 300 nm. In some embodiments, thickness T1 is zero.

The extension material layer 40 includes one or more of a carbon based material, a silicon oxide based material, and a silicon nitride based material in some embodiments. When the extension material layer is a carbon based material, a source gas for the CVD includes one selected from the group consisting of hydro carbon and fluorocarbon in some embodiments. One or more additional gases, such as $N_2$ and $H_2$, are also used in some embodiments. When the extension material layer is a silicon oxide based material, a source gas for the CVD includes a silicon containing gas, such as $SiH_4$, $SiH_2Cl_2$, $SiCl_4$ and $Si_2H_6$ together with an oxygen source gas, such as $O_2$, in some embodiments. One or more additional gases, such as $N_2$ and $H_2$, are also used in some embodiments. When the extension material layer is a silicon nitride based material, a source gas for the CVD includes a silicon containing gas, such as $SiH_4$, $SiH_2Cl_2$, $SiCl_4$ and $Si_2H_6$ together with a nitrogen source gas, such as $N_2$, $NH_3$ and $NO_2$ in some embodiments. Any other suitable material, such as an aluminum based material (aluminum oxide, aluminum nitride or aluminum oxynitride) or hafnium oxide, can be used as the extension material layer 40.

The CVD includes plasma enhanced CVD (PECVD) and low pressure CVD (LPCVD). The non-conformal deposition condition of CVD can be realized by adjusting one or more parameters of a pressure, a gas flow rate, a temperature and plasma power (in case of PECVD). In some embodiments, the pressure in a deposition chamber is in a range from about 1 mTorr to about 500 mTorr, and is in a range from about 20 mTorr to about 100 mTorr. In the case of PECVD, a bias voltage applied to the stage on which the substrate is placed is in a range from about 0V to 100 V.

Figure 2E:
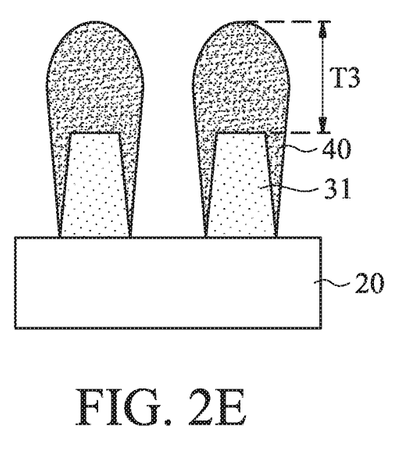
FIG. 2E is a cross sectional view of one of the various stages of a sequential pattern formation operation according to an embodiment of the present disclosure.

In some embodiments, after the extension material layer 40 is formed as shown in FIG. 2D, anisotropic etching is performed to remove the extension material layer 40 deposited on the surface of the target layer 20, as shown in FIG. 2E. In some embodiments, the thickness T3 of the extension material layer 40 deposited at the top face of the photo resist pattern 31 after the anisotropic etching is in a range from about 5 nm to about 200 nm. In some embodiments, side portions of the extension material layer 40 are also etched.

In some embodiments, by controlling a deposition amount to the side faces of the photo resist pattern 31, it is possible to reduce a space between adjacent line patterns. In some embodiments, the space is reduced by an amount in a range from about 0.2 nm to about 2.0 nm in some embodiments.

Figure 1E:
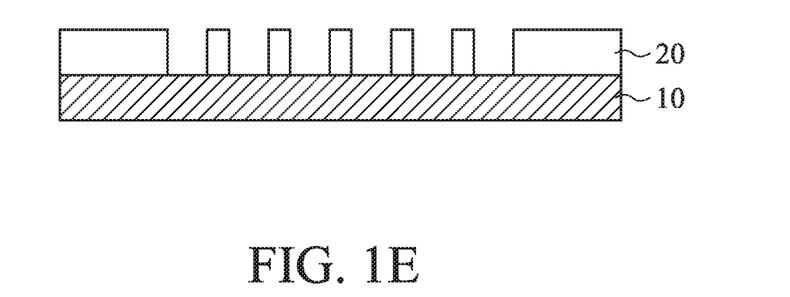
FIG. 1E is a cross sectional view of one of the various stages of a sequential pattern formation operation according to an embodiment of the present disclosure.

After the extension material layer 40 is formed, the target layer 20 is etched by using the extension material layer 40 and the photo resist pattern 31 as an etching mask. Thereafter, the extension material layer 40 and the photo resist pattern 31 are removed, as shown in FIG. 1E.

As set forth above, the extension material layer 40 can be preferentially formed on the top of the line patterns having relatively narrow spaces. When there is a large space (e.g., about 40 nm or more) in the photo resist pattern, the extension material layer 40 may be formed on the surface of the target layer 20. Accordingly, in some embodiments of the present disclosure, the photo resist pattern 31 does not have such a large space.

FIGS. 3A-3F show a sequential pattern formation operation according to an embodiment of the present disclosure. It is understood that additional operations can be provided before, during, and after the operations shown by FIGS. 3A-3F, and some of the operations described below can be replaced or eliminated, for additional embodiments of the method. The order of the operations/processes may be interchangeable. Materials, configuration, processes and/or dimensions as described in the forgoing embodiments may be employed in the following embodiments, detailed explanation thereof may be omitted.

Figure 3A:
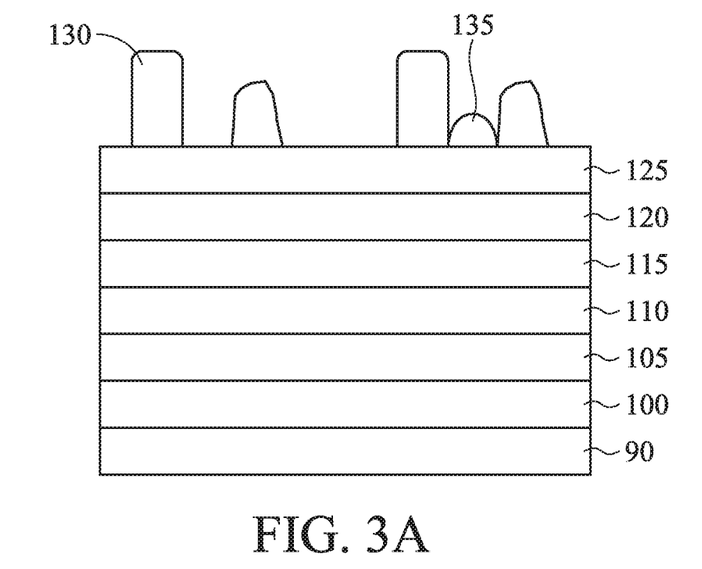
FIG. 3A is a cross sectional view of one of the various stages of a sequential manufacturing operation for a semiconductor device according to an embodiment of the present disclosure.

In the following embodiments, a multiple layer resist system is employed. In some embodiments, as shown in FIG. 3A, a first dielectric layer 100 is disposed over a substrate 90. In some embodiments, various underlying devices are formed on the substrate, and the first layer 100 disposed over the underlying devices. In some embodiments, one or more intermediate layers, such as an interlayer dielectric layer and an etching stop layer, are disposed under the first layer 100.

Examples of the underlying devices may include static random access memory (SRAM) and/or other logic circuits; passive components such as resistors, capacitors, and inductors; and active components such as P-channel field effect transistors (PFET), N-channel FET (NFET), metal-oxide semiconductor field effect transistors (MOSFET); complementary metal-oxide semiconductor (CMOS) transistors, such as a FinFET; bipolar transistors; high voltage transistors; high frequency transistors; other memory cells; and combinations thereof. The semiconductor device may include a plurality of semiconductor devices (e.g., transistors), which may be interconnected. It is understood, however, that the application should not be limited to a particular type of device, except as specifically claimed.

In some embodiments, the substrate 90 is a silicon substrate. Alternatively, the substrate 90 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. Amorphous substrates, such as amorphous Si or amorphous SiC, or an insulating material, such as silicon oxide may also be used as the substrate 90. The substrate 90 may include various regions that have been suitably doped with impurities (e.g., p-type or n-type conductivity).

In some embodiments, the first layer 100 is a dielectric layer including silicon oxide, silicon nitride, silicon oxynitride (SiON), SiOCN, fluorine-doped silicate glass (FSG), or a low-k dielectric material, or any other suitable dielectric material. In one embodiment, the first layer 100 is a low-k dielectric material layer. The expression "low-k" material refers to materials with a dielectric constant less than about 3.9. Suitable low-k dielectric materials include flowable oxides which are basically ceramic polymers, such as hydrogen silsesquioxane (HSQ). Additional low-k dielectrics include organic low-k materials, typically having a dielectric constant of about 2.0 to about 3.8. Organic low-k materials include a poly(arylene) ether, BCB (divinylsiloxane bis-benzocyclobutene), and organic-doped silica glasses (OSG) (also known as carbon-doped glasses). Other suitable types of low-k dielectrics are fluorine-doped silica glasses (FSG) and SiCOH. FSG include dielectrics formed from precursor gases $SiF_4$, $SiH_4$, and $N_2O$ and dielectrics formed from the precursors $SiF_4$, tetraethylorthosilicate (TEOS), and $O_2$. Dielectrics formed from TEOS and $SiF_4$ are known as fluorinated TEOS or FTEOS. The low-k dielectric material may be formed by CVD, atomic layer deposition (ALD), or other suitable film forming processes. The thickness of the first layer 100 is in a range from about 80 nm to about 150 nm in some embodiments.

Further, a second layer 105 is formed on the first layer 100 in some embodiments. The second layer 105 is a nitrogen-free dielectric layer in some embodiments. In certain embodiments, $SiO_2$ is used as the second layer 105. The second layer 105 can be fabricated in a CVD process, optionally plasma-enhanced, using a gaseous mixture of carbon, silicon, and oxygen sources. In some embodiments, the process parameters can be adjusted to obtain acceptable values of the refractive index n and extinction coefficient k.

In some embodiments, the second layer 105 is made of a tetraethylorthosilicate (TEOS) based dielectric material, which is a known layer commonly used as a crosslinking agent in silicone polymers and as a precursor to silicon dioxide in the semiconductor industry. In some embodiments, the TEOS based layer can be deposited by a spin-on-glass deposition method, although other deposition methods can be used. The thickness of the second layer 105 is in a range from about 20 nm to about 40 nm in some embodiments.

In addition, a third layer 110, as a hard mask layer in some embodiments, such as a TiN layer, is subsequently disposed over the second dielectric layer 105. The third layer 110 may be formed by CVD, ALD, or physical vapor deposition (PVD) including sputtering, or any other suitable film formation methods. The thickness of the third layer 110 is in a range from about 20 nm to about 40 nm in some embodiments.

Subsequently, a fourth layer 115 is formed over the third layer 110. In some embodiments, the fourth layer 115 is a dielectric layer made of one or more layers of a silicon oxide based material, a silicon nitride based material, or a silicon carbide based material. In certain embodiments, $SiO_2$ is used as the fourth layer 115. In some embodiments, the fourth layer 115 is made of a TEOS based dielectric material. In other embodiments, instead of a dielectric layer, an amorphous or polycrystalline semiconductor material, such as amorphous Si (a-Si), a-Ge, a-SiGe, polysilicon (poly-Si), poly-SiGe or poly-Ge, is formed over the third layer 110. The fourth layer 115 can be fabricated in a CVD process, optionally plasma-enhanced, using a gaseous mixture of carbon, silicon, and oxygen sources. The thickness of the third dielectric layer is in a range from about 30 nm to about 70 nm in some embodiments.

Still referring to FIG. 3A, a fifth layer 120 is formed over the fourth layer 115. In some embodiments, the fifth layer 120 is made of a dielectric material. In certain embodiments, the fifth layer 120 is made of an organic material. The organic material may include a plurality of monomers or polymers that are not cross-linked. Generally, the fifth layer 120 may contain a material that is patternable and/or have a composition tuned to provide anti-reflection properties. Exemplary materials for the fifth layer 120 include carbon backbone polymers. The fifth layer 120 is used to planarize the structure, as the underlying structure may be uneven depending on the structure of the devices formed on the substrate 90. In some embodiments, the fifth layer 120 is formed by a spin coating process. In other embodiments, the fifth layer 120 is formed by another suitable deposition process. The thickness of the fifth layer 120 is in a range from about 80 nm to about 120 nm in some embodiments.

The sixth layer 125 is formed over the fifth layer 120. In some embodiments, the sixth layer 125 has a composition that provides anti-reflective properties and/or hard mask properties for the photolithography process. In some embodiments, the sixth layer 125 includes a silicon containing layer (e.g., a silicon hard mask material). The sixth layer 125 may include a silicon-containing inorganic polymer. In other embodiments, the sixth layer 125 includes silicon oxide (e.g., spin-on glass (SOG)), silicon nitride, silicon oxynitride, polycrystalline silicon, a metal-containing organic polymer material that contains metal such as titanium, titanium nitride, aluminum, and/or tantalum; and/or other suitable materials. The sixth layer 125 may be formed by a spin-on coating process, CVD, PVD, and/or other suitable deposition processes. The thickness of the sixth layer 125 is in a range from about 15 nm to about 30 nm in some embodiments.

Further, as shown in FIG. 3A, a photo resist pattern 130 is formed on the sixth layer 125 by one or more lithography operations, similar to FIGS. 1A-1C. In some embodiments, a resist residue (scum) 135 remains on the surface of the sixth layer 125. The resist residue may cause a bridge defect between adjacent patterns or other defects.

Figure 3B:
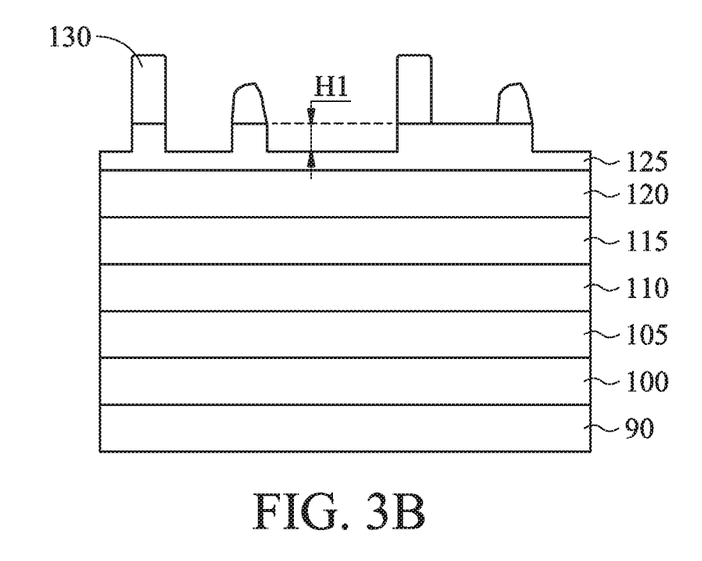
FIG. 3B is a cross sectional view of one of the various stages of a sequential manufacturing operation for a semiconductor device according to an embodiment of the present disclosure.

In some embodiments, to remove the resist residue (scum), one or more first descum etching operations are performed on the photo resist pattern 130. In some embodiments, the first descum etching operation utilizes an etching gas including fluorine, such as a fluorocarbon (e.g., $CF_4$). By the first descum etching operation, the resist residue 135 is removed. In some embodiments, a part of the photo resist pattern 130 and/or a part of the sixth layer 125 are also removed, as shown in FIG. 3B. An amount H1 of etching of the sixth layer 125 is in a range from about 1 nm to about 5 nm in some embodiments.

Figure 3C:
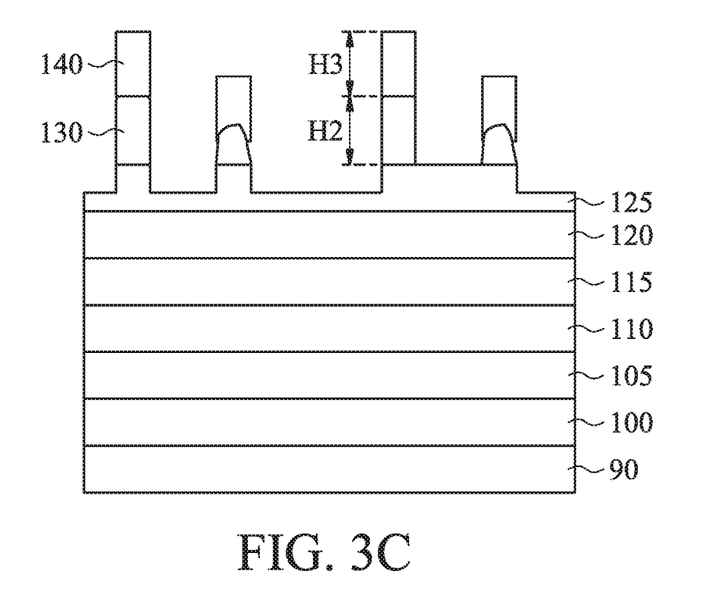
FIG. 3C is a cross sectional view of one of the various stages of a sequential manufacturing operation for a semiconductor device according to an embodiment of the present disclosure.

Subsequently, similar to the operations explained with respect to FIGS. 1D and 2A-2E, an extension material layer 140 is formed over the photo resist pattern 130, as shown in FIG. 3C. A height (thickness) H2 of the photo resist pattern 130 is in a range from about 50 nm to about 200 nm in some embodiments. A thickness H3 of the extension material layer 140 deposited at the top face of the photo resist pattern 130 is in a range from about 5 nm to about 200 nm.

In some embodiments, after the extension material layer 40 is formed, one or more second descum etching operations are performed. In some embodiments, the second descum etching operation utilizes an etching gas including chlorine, such as C12. By the second descum etching operation, residues or metal-line scums are removed. In some embodiments, the sixth layer 125 is further partially etched during the second descum etching operation. An amount of etching is in a range from about 1 nm to about 5 nm in some embodiments.

In some embodiments, the first descum etching operation is not performed, and only the second descum etching operation is performed after the extension material layer 140 is formed. In other embodiments, the second descum etching operation is not performed, and only the first descum etching operation is performed before the extension material layer 140 is formed.

As shown in FIGS. 3A-3C, the photo resist patterns 130 may have a thin portion having a smaller thickness than other portions. If the extension material layer is not formed, the thin portion having a smaller thickness may be cut during the descum etching operation or a subsequent etching operation to pattern the sixth layer 125. By forming the extension material layer 140, it is possible to substantially increase the "mask pattern" for the subsequent etching. Thus, even if the photo resist patterns 130 has a thin portion having a smaller thickness, it is possible to prevent a pattern defect (an open circuit defect). Further, since it is possible to compensate the thickness of the photo resist pattern 130, it is possible to effectively remove resist residues by the descum etching operations which may also etch the photo resist pattern 130.

Figure 3D:
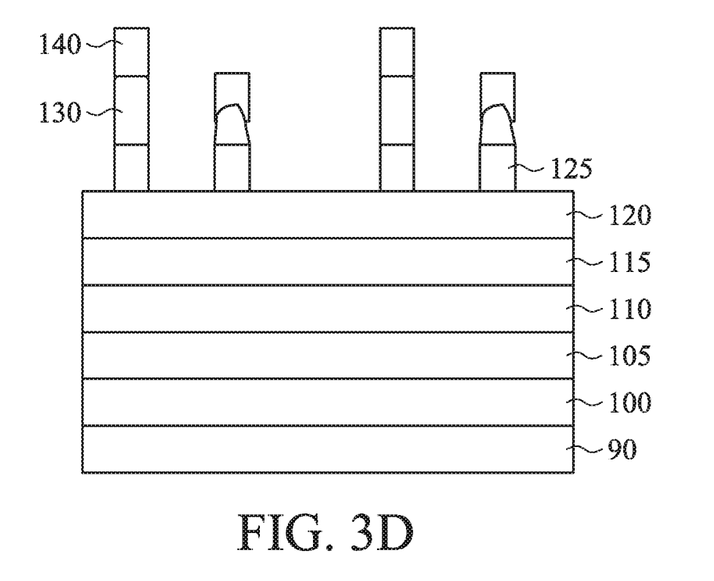
FIG. 3D is a cross sectional view of one of the various stages of a sequential manufacturing operation for a semiconductor device according to an embodiment of the present disclosure.

Then, by using the extension material layer 140 and the photo resist pattern 130 as an etching mask, the sixth layer 125 is patterned, as shown in FIG. 3D. After the etching, the extension material layer 140 and the photo resist layer 130 are removed in some embodiments.

Figure 3E:
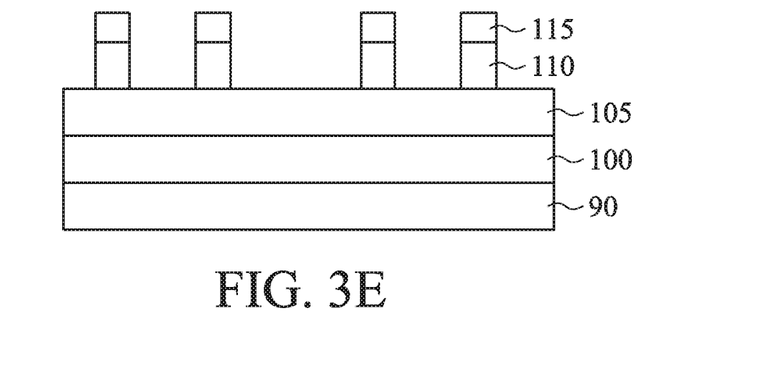
FIG. 3E is a cross sectional view of one of the various stages of a sequential manufacturing operation for a semiconductor device according to an embodiment of the present disclosure.
Figure 3F:
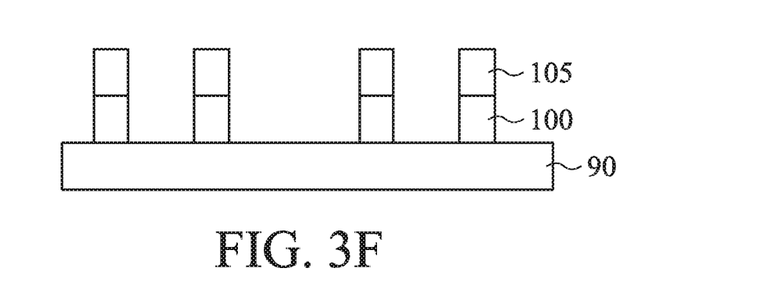
FIG. 3F is a cross sectional view of one of the various stages of a sequential manufacturing operation for a semiconductor device according to an embodiment of the present disclosure.

Further, as shown in FIG. 3E, the fifth layer 120, the fourth layer 115 and the third layer 110 are patterned by using the patterned sixth layer 125 as an etching mask. The patterning operation includes one or more plasma dry etching operations. Then, in some embodiments, the patterned sixth layer 125, the patterned fifth layer 130 are removed, as shown in FIG. 3E. Subsequently, as shown in FIG. 3F, by using the patterned fourth layer 115 and the patterned third layer 110 as an etching mask, the second layer 105 and the first layer 100 are patterned, as shown in FIG. 3F. After the patterning, the patterned fourth layer 115 and the patterned third layer 110 are removed.

It is understood that the structure shown in FIG. 3F undergoes further CMOS processes to form various features such as interconnect vias, interconnect metal layers, passivation layers, etc.

FIGS. 4A-4D show a sequential pattern formation operation according to an embodiment of the present disclosure. It is understood that additional operations can be provided before, during, and after the operations shown by FIGS. 4A-4D, and some of the operations described below can be replaced or eliminated, for additional embodiments of the method. The order of the operations/processes may be interchangeable. Materials, configuration, processes and/or dimensions as described in the forgoing embodiments may be employed in the following embodiments, detailed explanation thereof may be omitted.

Figure 4A:
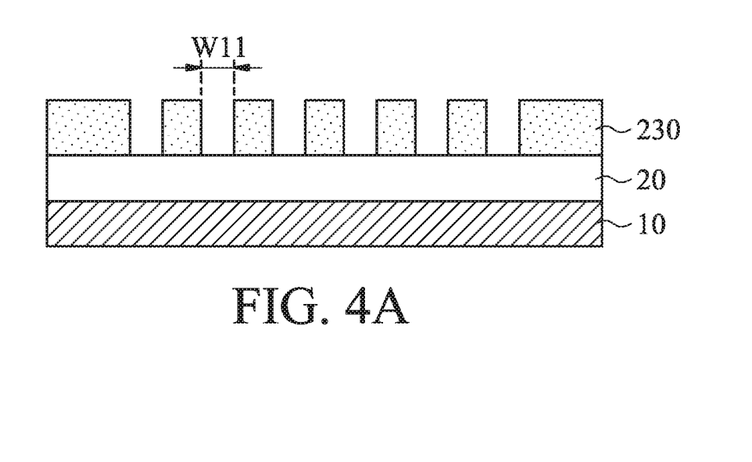
FIG. 4A is a cross sectional view of one of the various stages of a sequential pattern formation operation according to another embodiment of the present disclosure.
Figure 4B:
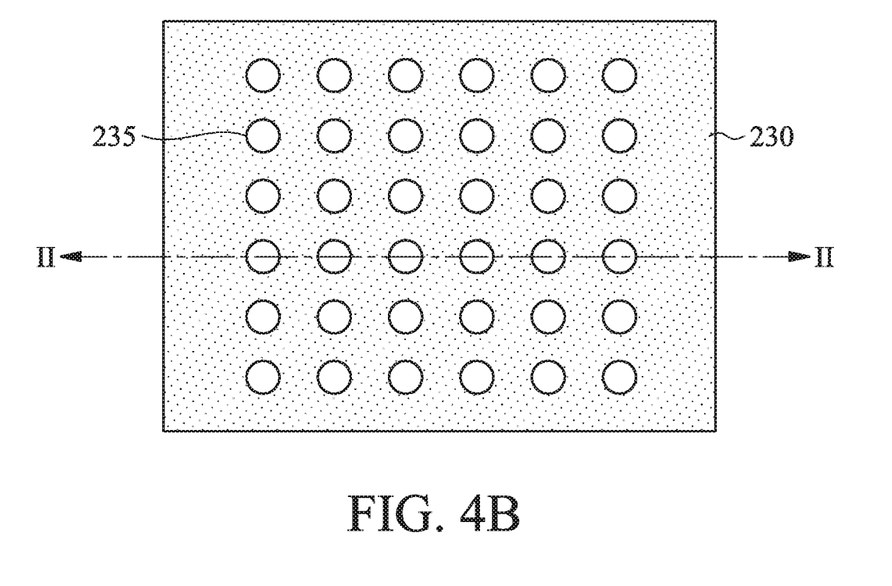
FIG. 4B is a top view (plan view) of one of the various stages of a sequential pattern formation operation according to another embodiment of the present disclosure.

In the following embodiments, a photo resist layer 230 includes a plurality of hole patterns 235 as shown in FIGS. 4A and 4B. FIG. 4A is a cross sectional view corresponding to line II-II of FIG. 4B, and FIG. 4B is a top view (plan view).

Figure 4C:
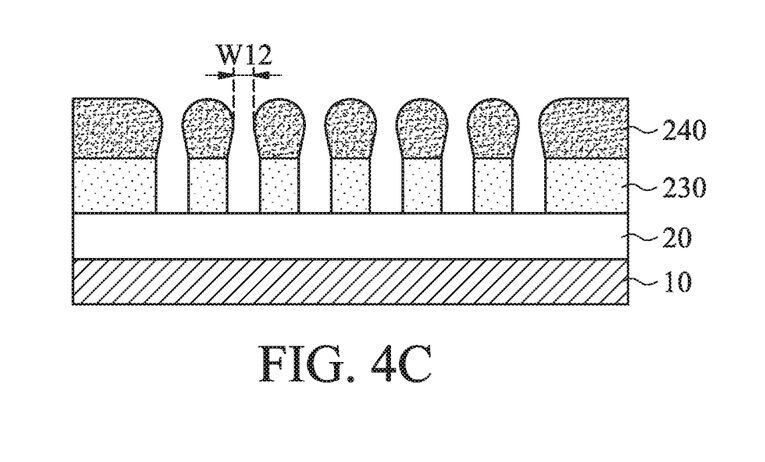
FIG. 4C is a cross sectional view of one of the various stages of a sequential pattern formation operation according to another embodiment of the present disclosure.
Figure 4D:
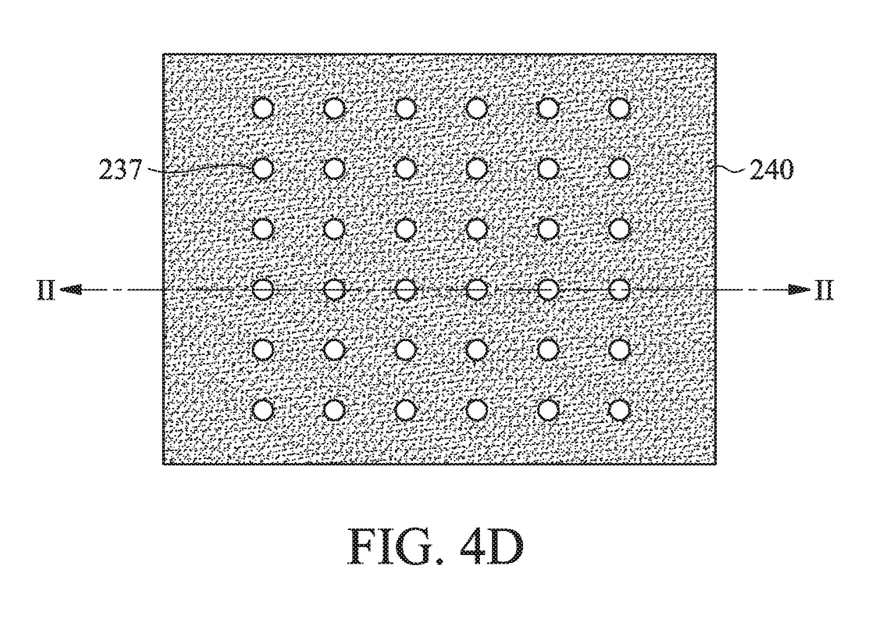
FIG. 4D is a top view of one of the various stages of a sequential pattern formation operation according to another embodiment of the present disclosure.

As shown in FIG. 4A, the hole pattern 235 has a diameter W11 in a range from about 5 nm to about 40 nm in some embodiments. By performing operations as explained with FIGS. 2A-2E, an extension material layer 240 is formed over the photo resist layer 230. After the deposition or the optional anisotropic etching, the size (diameter) of the hole patterns 237 are reduced, as shown in FIGS. 4C and 4D. FIG. 4C is a cross sectional view and FIG. 4D is a top view. The diameter W12 of the reduced hole patterns 237 is in a range from about 3 nm to about 30 nm in some embodiments.

The various embodiments or examples described herein offer several advantages over the existing art. In the present disclosure, an extension material layer is formed over a photo resist pattern to increase a "height" of the photo resist pattern. By forming the extension material layer, even if the photo resist patterns have thin portions having a smaller thickness, it is possible to prevent a pattern defect (an open circuit defect). Further, since it is possible to compensate for the thickness of the photo resist pattern 130, it is possible to effectively remove resist residues by the descum etching operations which may also etch the photo resist pattern.

According to one aspect of the present disclosure, in a pattern formation method, a photo resist pattern is formed over a target layer to be patterned. An extension material layer is formed on the photo resist pattern. The target layer is patterned by using at least the extension material layer as an etching mask. In one or more of the foregoing and the following embodiments, the photo resist pattern includes line patterns, and the extension material layer is formed on each of the line patterns. In one or more of the foregoing and the following embodiments, the extension material layer is deposited on a surface of the target layer between the line patterns, and a thickness T1 of the extension material layer deposited on the surface of the target layer between the line patterns and a thickness T2 of the extension material layer deposited on each of the line patterns satisfy 2≤T2/T1. In one or more of the foregoing and the following embodiments, 30≤T2/T1≤300 is satisfied. In one or more of the foregoing and the following embodiments, the extension material layer formed on a surface of the target layer is etched before the target layer is etched. In one or more of the foregoing and the following embodiments, an aspect ratio of each of the line patterns is at least 2. In one or more of the foregoing and the following embodiments, a space between adjacent line patterns is in a range from about 5 nm to about 20 nm. In one or more of the foregoing and the following embodiments, the extension material layer is deposited by chemical vapor deposition (CVD) under a non-conformal deposition condition. In one or more of the foregoing and the following embodiments, the CVD is plasma CVD performed under a pressure equal to or higher than 20 mTorr. In one or more of the foregoing and the following embodiments, the extension material layer includes one selected from the group consisting of a carbon based material, a silicon oxide based material, and a silicon nitride based material. In one or more of the foregoing and the following embodiments, a source gas for the CVD includes one selected from the group consisting of hydro carbon and fluorocarbon. In one or more of the foregoing and the following embodiments, a source gas for the CVD includes a silicon containing gas.

In accordance with another aspect of the present disclosure, in a method of manufacturing a semiconductor device, a photo resist pattern is formed over a target layer to be patterned. A descum etching is performed to remove photo resist residue. An extension material layer is formed on the photo resist pattern. The target layer is patterned by using at least the extension material layer as an etching mask. In one or more of the foregoing and the following embodiments, the descum etching is performed after the extension material layer is deposited. In one or more of the foregoing and the following embodiments, in the descum etching, a part of the target layer is etched. In one or more of the foregoing and the following embodiments, the descum etching includes a first descum etching and a second descum etching performed under a different condition than the first descum etching, and the extension material layer is deposited between the first descum etching and the second descum etching. In one or more of the foregoing and the following embodiments, the first descum etching is performed before the extension material layer is deposited and an etching gas includes fluorine, and the second descum etching is performed after the extension material layer is deposited and an etching gas includes chlorine.

In accordance with another aspect of the present disclosure, in a method of manufacturing a semiconductor device, a first dielectric layer is formed over a semiconductor substrate. A nitrogen-free layer is formed over the first dielectric layer. A metallic hard mask layer is formed over the nitrogen-free layer. A second dielectric layer is formed over the metallic hard mask layer. A third dielectric layer is formed over the second dielectric layer. A fourth dielectric layer is formed over the third dielectric layer. A photo resist pattern over a fourth dielectric layer. A descum etching is performed to remove photo resist residue. An extension material layer is formed on the photo resist pattern. The fourth dielectric layer is patterned by using at least the extension material layer as an etching mask. In one or more of the foregoing and the following embodiments, the third dielectric layer is patterned by using the patterned fourth dielectric layer as an etching mask. The second dielectric layer and the metallic hard mask layer are patterned by using the patterned third dielectric layer as an etching mask. The first dielectric layer is patterned by using the patterned metallic hard mask layer and second dielectric layer as an etching mask. In one or more of the foregoing and the following embodiments, the first dielectric layer is made of a low-k dielectric material, and the metallic hard mask layer is made of TiN.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pattern formation method, comprising:
   forming a photo resist pattern over a target layer to be patterned;
   forming an extension material layer on the photo resist pattern; and
   patterning the target layer by using at least the extension material layer as an etching mask,
   wherein a thickness of the extension material layer on a top face of the photo resist pattern is greater than a thickness of the extension material layer on a side face of the photo resist pattern, and
   the photo resist pattern includes line patterns having different thicknesses.

2. The pattern formation method of claim 1, wherein:
   the extension material layer is formed on each of the line patterns.

3. The pattern formation method of claim 2, wherein:
   the extension material layer is formed on a surface of the target layer between the line patterns, and
   a thickness T1 of the extension material layer formed on the surface of the target layer between the line patterns and a thickness T2 of the extension material layer formed on a top face of each of the line patterns satisfy $2 \leq T2/T1$.

4. The pattern formation method of claim 3, wherein $30 \leq T2/T1 \leq 300$.

5. The pattern formation method of claim 3, further comprising etching the extension material layer formed on a surface of the target layer before the target layer is etched.

6. The pattern formation method of claim 5, wherein in the etching the extension material layer, side portions of the extension material layer are also etched.

7. The pattern formation method of claim 2, wherein an aspect ratio of each of the line patterns is at least 2.

8. The pattern formation method of claim 7, wherein a space between adjacent line patterns is in a range from about 5 nm to about 20 nm.

9. The pattern formation method of claim 1, wherein the extension material layer is formed by chemical vapor deposition (CVD) under a non-conformal deposition condition.

10. The pattern formation method of claim 9, wherein the CVD is plasma CVD performed under a pressure equal to or higher than 20 mTorr.

11. The pattern formation method of claim 9, wherein the extension material layer includes one selected from the group consisting of a carbon based material, a silicon oxide based material, and a silicon nitride based material.

12. The pattern formation method of claim 9, wherein a source gas for the CVD includes one selected from the group consisting of hydro carbon and fluorocarbon.

13. The pattern formation method of claim 9, wherein a source gas for the CVD includes a silicon containing gas.

14. The pattern formation method of claim 1, wherein a part of the side face of the photo resist pattern is exposed from the extension material layer.

15. The pattern formation method of claim 1, wherein above the top surface of the photo resist pattern, a width of the extension material layer increases and then decreases as a distance from the target layer increases.

16. A method of manufacturing a semiconductor device, comprising:
   forming a photo resist pattern over a target layer to be patterned;
   performing a descum etching to remove photo resist residue;
   forming an extension material layer on the photo resist pattern; and
   patterning the target layer by using at least the extension material layer as an etching mask, wherein:
   the descum etching includes a first descum etching and a second descum etching performed under a different condition than the first descum etching,
   the first descum etching is performed before the extension material layer is formed and an etching gas includes fluorine, and
   the second descum etching is performed after the extension material layer is formed and an etching gas includes chlorine.

17. A method of manufacturing a semiconductor device, comprising:
   forming a first dielectric layer over a semiconductor substrate;
   forming a nitrogen-free layer over the first dielectric layer;
   forming a metallic hard mask layer over the nitrogen-free layer;
   forming a second dielectric layer over the metallic hard mask layer;
   forming a third dielectric layer over the second dielectric layer;
   forming a fourth dielectric layer over the third dielectric layer;

forming a photo resist pattern over a fourth dielectric layer;
performing a descum etching to remove photo resist residue;
forming an extension material layer on the photo resist pattern; and
patterning the fourth dielectric layer by using at least the extension material layer as an etching mask,
wherein the photo resist pattern includes line patterns having different thicknesses.

18. The method of claim 17, further comprising:
patterning the third dielectric layer by using the patterned fourth dielectric layer as an etching mask;
patterning the second dielectric layer and the metallic hard mask layer by using the patterned third dielectric layer as an etching mask; and
patterning the first dielectric layer by using the patterned metallic hard mask layer and second dielectric layer as an etching mask.

19. The method of claim 18, wherein:
the first dielectric layer is made of a low-k dielectric material, and
the metallic hard mask layer is made of TiN.

20. The pattern formation method of claim 17, wherein the descum etching partially etch the fourth dielectric layer in an amount of 1 nm to 5 nm.

* * * * *